(12) United States Patent
Lin et al.

(10) Patent No.: US 10,123,439 B1
(45) Date of Patent: Nov. 6, 2018

(54) COVER AND ELECTRONIC DEVICE

(71) Applicants: INVENTEC (PUDONG) TECHNOLOGY CORPORATION, Shanghai (CN); INVENTEC CORPORATION, Taipei (TW)

(72) Inventors: Yu-Cheng Lin, Taipei (TW); Hsien-Wei Juan, Taipei (TW); Kuo-Hsuen Yen, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 15/855,973

(22) Filed: Dec. 27, 2017

(30) Foreign Application Priority Data

Sep. 6, 2017 (CN) .......................... 2017 1 0794408

(51) Int. Cl.
*H05K 5/03* (2006.01)
*H05K 5/02* (2006.01)
*G06F 1/18* (2006.01)

(52) U.S. Cl.
CPC .............. *H05K 5/03* (2013.01); *G06F 1/182* (2013.01); *H05K 5/0243* (2013.01)

(58) Field of Classification Search
CPC .......... H05K 5/03; H05K 5/0243; G06F 1/182
USPC .............................. 361/679.01, 679.02, 752; 312/223.1–223.3
See application file for complete search history.

(56) References Cited

U.S. PATENT DOCUMENTS

| 2006/0082265 A1* | 4/2006 | Quijano ................. G06F 1/181 312/223.2 |
| 2008/0112122 A1* | 5/2008 | Chang ................. G11B 33/124 361/679.01 |
| 2008/0200048 A1* | 8/2008 | Matsuura ............. H01R 12/616 439/78 |
| 2015/0375513 A1* | 12/2015 | Nishimura ........... B41J 2/17513 347/86 |

* cited by examiner

*Primary Examiner* — Steven T Sawyer
*Assistant Examiner* — Sagar Shrestha
(74) *Attorney, Agent, or Firm* — Maschoff Brennan

(57) ABSTRACT

An electronic device includes a casing, an electronic assembly and a cover. The casing has an interior space. The electronic assembly is located in the interior space. The cover includes a first covering member and a second covering member. The first covering member is disposed on the casing, and covers the interior space. The second covering member has a sign, and the second covering member is rotatably disposed on the first covering member in order to change the position of the sign.

7 Claims, 5 Drawing Sheets

COVER AND ELECTRONIC DEVICE

CROSS-REFERENCE TO RELATED APPLICATIONS

This non-provisional application claims priority under 35 U.S.C. § 119(a) on Patent Application No(s). 201710794408.4 filed in China on Sep. 6, 2017, the entire contents of which are hereby incorporated by reference.

BACKGROUND OF THE INVENTION

Technical Field of the Invention

The disclosure relates to a cover and an electronic device, more particularly to a cover having a movable covering member and an electronic device having the same.

Description of the Related Art

In the related art, barebone computers can be placed on a table or hung on the back of a display device. The barebone computers have their own logo on its surface, and the logo can be more recognizable when it is seen from a certain point of view.

SUMMARY OF THE INVENTION

One embodiment of the disclosure provides an electronic device includes a casing, an electronic assembly and a cover. The casing has an interior space. The electronic assembly is located in the interior space. The cover includes a first covering member and a second covering member. The first covering member is disposed on the casing, and covers the interior space. The second covering member has a sign, and the second covering member is rotatably disposed on the first covering member in order to change the position of the sign.

One embodiment of the disclosure provides a cover includes a first covering member and a second covering member. The second covering member has a sign and the second covering member is rotatably disposed on the first covering member in order to change the position of the sign.

BRIEF DESCRIPTION OF THE DRAWINGS

The disclosure will become more fully understood from the detailed description given herein below and the accompanying drawings which are given by way of illustration only and thus are not limitative to the present disclosure and wherein.

DETAILED DESCRIPTION

Figure 1:
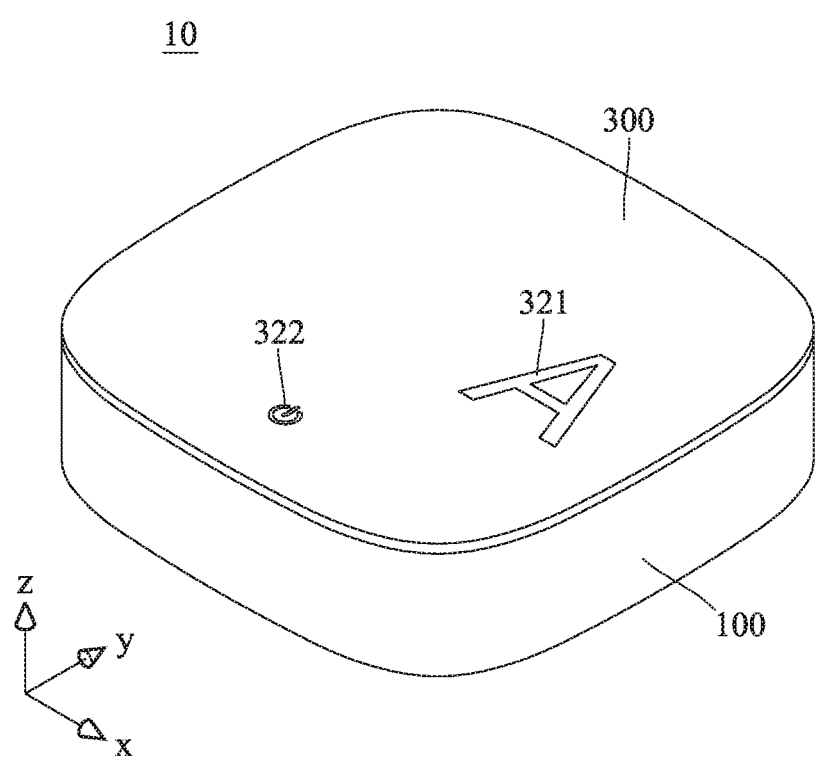
FIG. 1 is a perspective view of an electronic device according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
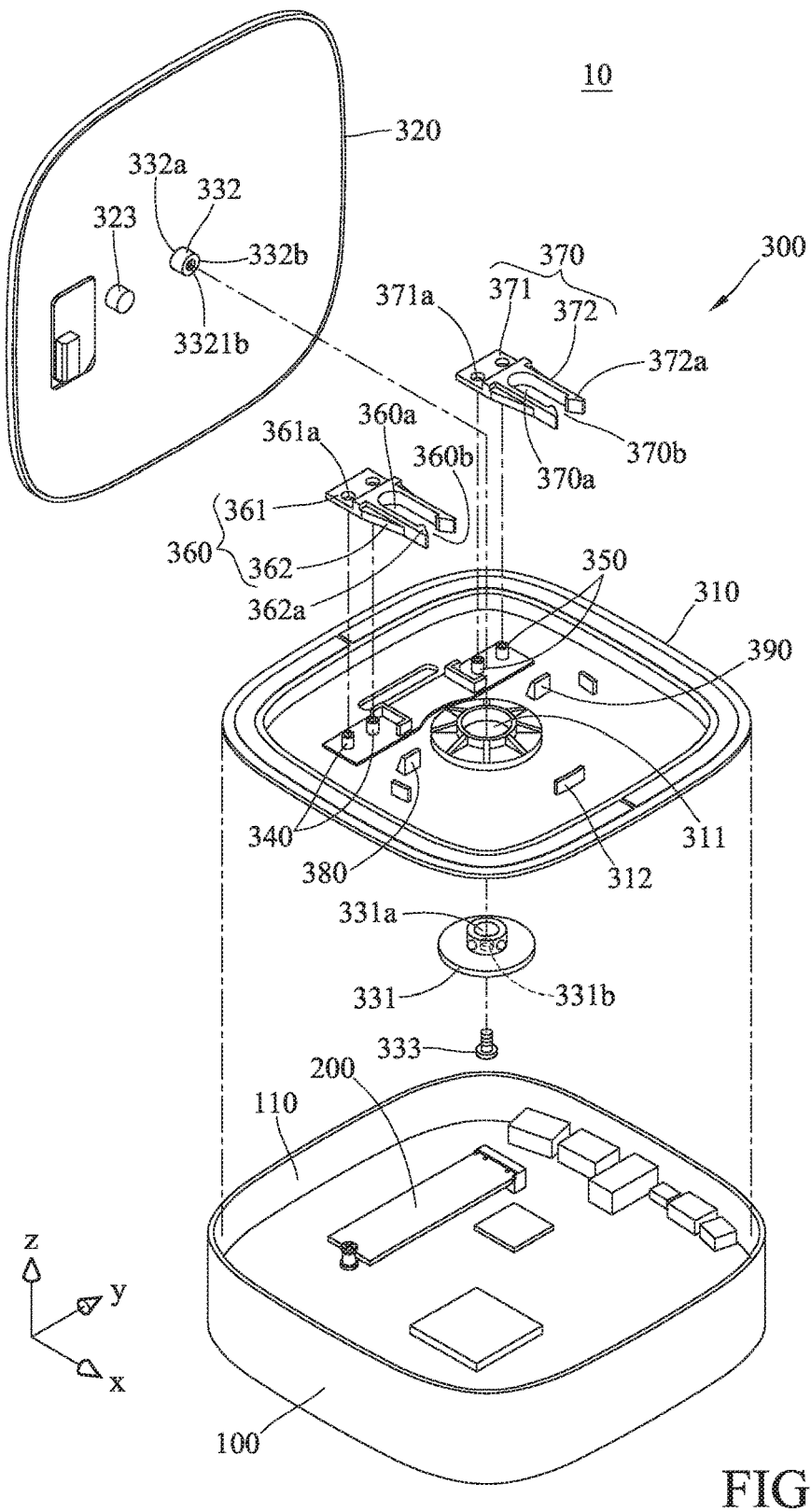
FIG. 2 is an exploded view of the electronic device in FIG. 1.
Figure 3:
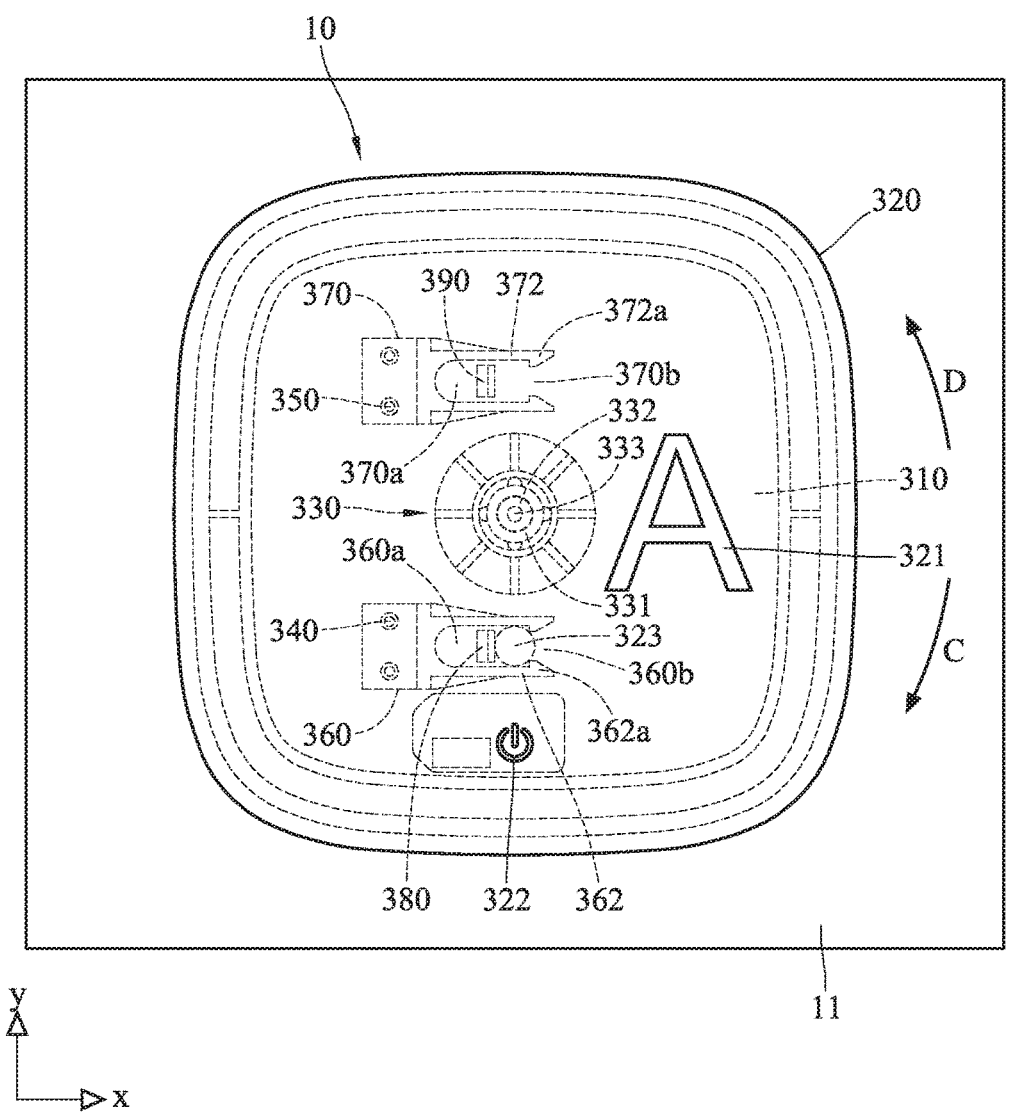
FIG. 3 is a top view of the electronic device in FIG. 1 being put on a table.

Please refer to FIG. 1 to FIG. 3. FIG. 1 is a perspective view of an electronic device according to a first embodiment of the disclosure. FIG. 2 is an exploded view of the electronic device in FIG. 1. FIG. 3 is a top view of the electronic device in FIG. 1 being put on a table.

This embodiment provides an electronic device 10, such as a barebone computer. The electronic device 10 includes a casing 100, an electronic assembly 200, and a cover 300. The casing 100 has an interior space 110. The electronic assembly 200 is located in the interior space 110. The cover 300 includes a first covering member 310, a second covering member 320 and a rotating assembly 330.

The first covering member 310 is disposed on the casing 100 and covers the interior space 110. The first covering member 310 has a pivot hole 311 and three cable arrangement structures 312. The cable arrangement structures 312 are disposed on a surface of the first covering member 310 facing away from the casing 100.

The second covering member 320 has a sign 321, a power switch 322 and a fixing pillar 323. The sign 321 is, for example, a brand logo. This embodiment takes the English letter A as an example of the sign. The power switch 322 is electrically connected to the electronic assembly 200 in order to turn on or turn off the electronic assembly 200.

The rotating assembly 330 includes a base 331, a pivot 332 and a fastener 333. The base 331 is disposed on a side of the pivot hole 311 far away from the second covering member 320. The base 331 has a slot 331a and a through hole 331b connected to the slot 331a. The pivot 332 has a connecting end 332a and a fixing end 332b opposite to each other. The connecting end 332a is connected to the second covering member 320. The fixing end 332b is rotatably inserted into the slot 331a, enable the second covering member 320 to be rotated with respect to the first covering member 310. As the second covering member 320 is rotated with respect to the first covering member 310, the position of the sign 321 is changed. For example, the tip of the English letter A can be oriented to point along the negative y-axis or the negative x-axis.

In addition, the fixing pillar 323 is spaced apart from the pivot 332. Therefore, when the second covering member 320 is rotated, the fixing pillar 323 goes around an axis of the pivot 332. Further, the fixing end 332b has a threaded hole 3321b. The fastener 333 is able to be screwed into the threaded hole 3321b through the through hole 331b.

Moreover, the cover 300 further includes two first protrusions 340, two second protrusions 350, a first positioning member 360, a second positioning member 370, a first stopper 380 and a second stopper 390.

The two first protrusions 340 and the two second protrusions 350 are disposed on the side of the first covering member 310 facing the second covering member 320. The first protrusions 340 and the second protrusions 350 are respectively located on two opposite sides of the pivot hole 311.

The first positioning member 360 includes a first fixing base 361 and two first holding arms 362. The first fixing base 361 has two first fixing holes 361a penetrated by the two first protrusions 340, such that the first positioning member 360 is fixed on the side of the first covering member 310 facing the second covering member 320. The two first holding arms 362 extend outward from one side of the first fixing base 361. The first positioning member 360 has a first accommodating space 360a located between the two first holding arms 362. The first accommodating space 360a has a first opening 360b. Each of the ends of the two first holding arms 362, far away from the first fixing base 361, has a first tooth 362a. The first stopper 380 is disposed on the side of first covering member 310 facing the second covering member 320, and is located in the first accommodating space 360a.

The second positioning member 370 includes a second fixing base 371 and two second holding arms 372. The second fixing base 371 has two second fixing holes 371a penetrated by the two second protrusions 350, such that the second positioning member 370 is fixed on the side of first covering member 310 facing the second covering member 320. The two second holding arms 372 extend outward from one side of the second fixing base 371. The second covering member 320 has a second accommodating space 370a located between the two second holding arms 372. The second accommodating space 370a has a second opening 370b. Each of the ends of the two second holding arms 372, far away from the second fixing base 371, has a second tooth 372a. The second stopper 390 is disposed on the side of the first covering member 310 facing the second covering member 320, and is located in the second accommodating space 370a.

Please further refer to FIG. 3, in this embodiment, the fixing pillar 323 is movable to be moved to the first positioning member 360 or the second positioning member 370. In detail, when the fixing pillar 323 is moved in a direction C to enter the first accommodating space 360a through the first opening 360b, the first stopper 380 is able to stop the fixing pillar 323, and the two first holding arms 362 and the first teeth 362a are able to hold the fixing pillar 323 in position. As a result, the sign 321 is oriented in a desired position. On the other hand, when the fixing pillar 323 is moved in a direction D, which is opposite to the direction C, to enter the second accommodating space 370a through the second opening 370b, the second stopper 390 is able to stop the fixing pillar 323, and the two second holding arms 372 and the second teeth 372a are able to hold the fixing pillar 323 in position, such that the sign 321 is then oriented in an opposite position.

It is noted that the positions of the first protrusions 340 and the second protrusions 350 are not restricted, and may be changed according to actual requirements. Furthermore, the first protrusions 340 and the second protrusions 350 are optional. For example, in some other embodiments, the first positioning member, the second positioning member and the first covering member may be integrated into a single unit.

In addition, the first stopper 380 and the second stopper 390 are optional. For example, in some other embodiments, the cover may have no stopper, the holding arms and the teeth are still able to hold the fixing pillar in position.

Moreover, the first positioning member 360 and the second positioning member 370 are optional. For example, in some other embodiments, the cover may have no positioning member, the second covering member may be positioned in different positions through the pivot and the base of the rotating assembly.

Figure 4:
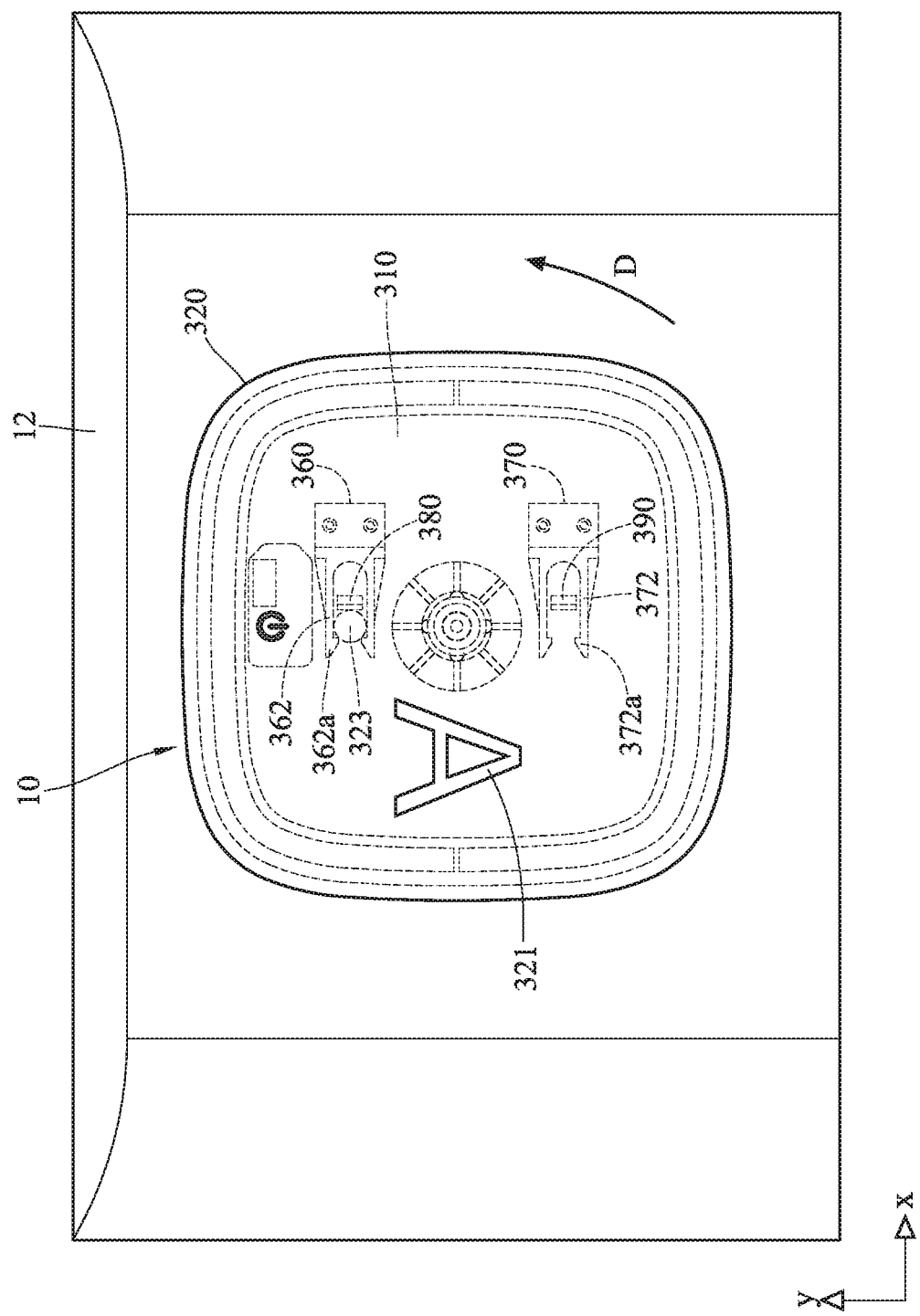
FIG. 4 is a front view of the electronic device in FIG. 1 being disposed behind a display device.
Figure 5:
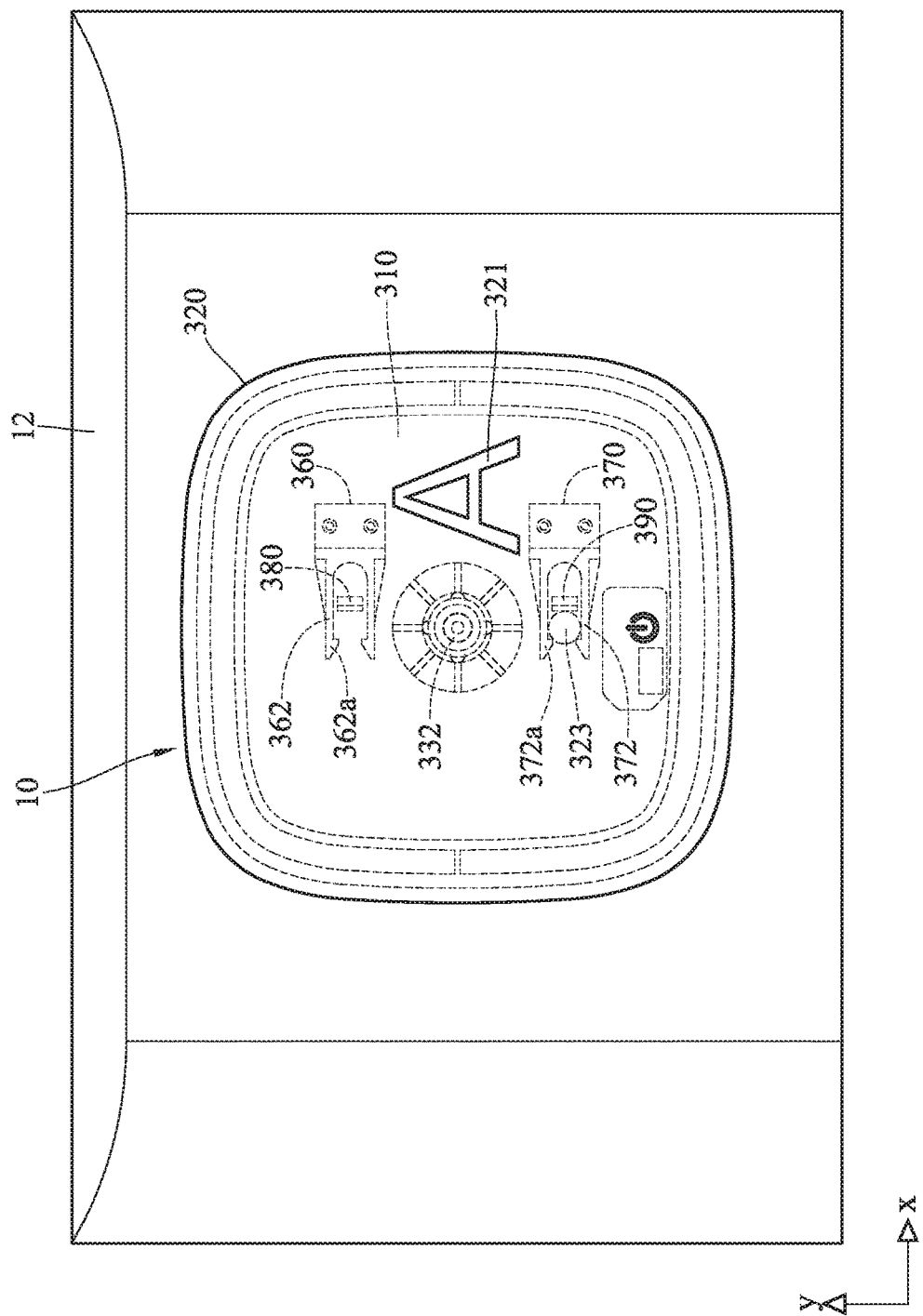
FIG. 5 is a front view of the electronic device in FIG. 4 when a second covering member is being rotated.

Then, please refer to FIG. 4 and FIG. 5. FIG. 4 is a front view of the electronic device in FIG. 1 being disposed behind a display device. FIG. 5 is a front view of the electronic device in FIG. 4 when a second covering member is being rotated.

In this embodiment, the electronic device 10 can be placed in different places, such as a table 11 (as shown in FIG. 3) or the rear side of a display device 12 (as shown in FIGS. 4-5), and the sign 321 on the second covering member 320 can be oriented in a desired position. The display device 12 is, for example, a television or a computer screen.

For example, as shown in FIG. 4, the electronic device 10 is mounted on the rear side of the display device 12. However, the sign 321 is up-side-down because of the design of mounting the electronic device 10 to the display device 12. In such a case, the second covering member 320 is able to be rotated in the direction D to change the position of the sign 321. As a result, as shown in FIG. 5, the sign 321 is oriented in a desired position.

Moreover, it is noted that the first positioning member 360 and second positioning member 370 not only can position the second covering member 320, but also can prevent the second covering member 320 from overly rotated to pull the cables inside the electronic device 10. In addition, with the help of the cable arrangement structures 312 (as shown in FIG. 2), the cables can be organized so as to reduce the possibility of being pulled while the second covering member 320 rotates.

According to the electronic device as discussed above, the cover has two covering members; one of them has a sign, and is able to be rotated with respect to the other, such that the sign is able to be oriented in a desired position. As a result, it is convenient and easy to adjust the position of the sign by rotating the covering member, instead of detaching the whole cover.

In addition, the fixing pillar is able to be held in position by the positioning members so that the covering member is prevented from being overly rotated to pull the cables inside the electronic device.

The embodiments were chosen and described in order to best explain the principles of the disclosure and its practical applications, to thereby enable others skilled in the art to best utilize the disclosure and various embodiments with various modifications as are suited to the particular use contemplated. It is intended that the scope of the disclosure be defined by the following claims and their equivalents.

What is claimed is:
1. An electronic device, comprising:
a casing having an interior space;
an electronic assembly located in the interior space; and
a cover, comprising:
a first covering member disposed on the casing and covering the interior space, and the first covering member having a pivot hole;
a second covering member having a sign and a fixing pillar, and the second covering member disposed on the first covering member;
a rotating assembly comprising a base, a pivot and a fastener, the base disposed on a side of the pivot hole, the base having a slot and a through hole which is connected to the slot, the fixing pillar spaced apart from the pivot, the pivot having a connecting end and a fixing end opposite to each other, the connecting end connected to the second covering member, the fixing end rotatably inserted into the slot, the fixing end having a threaded hole, and the fastener penetrating through the through hole and fixed to the threaded hole; and
a first positioning member and a second positioning member disposed on a side of the first covering member far away from the casing, the first positioning member and the second positioning member located on different sides of the pivot hole, and the fixing pillar being movable to be moved to the first positioning member or the second positioning member;

wherein the second covering member is rotatable with respect to the first covering member via the pivot in order to change the position of the sign.

2. The electronic device according to the claim 1, wherein the first positioning member and the second positioning member are located on two opposite sides of the pivot hole.

3. The electronic device according to the claim 2, wherein the first positioning member comprises a first fixing base and two first holding arms, the first fixing base is fixed on the side of the first covering member far away from the casing, the two first holding arms extend outward from one side of the first fixing base, the first positioning member has a first accommodating space located between the two first holding arms, the first accommodating space has a first opening, allowing the fixing pillar to enter the first accommodating space from the first opening, the second positioning member comprises a second fixing base and two second holding arms, the second fixing base is fixed on the side of the first covering member far away from the casing, the two second holding arms extend from outward from one side of the second fixing base, the second positioning member has a second accommodating space located between the two second holding arms, and the second accommodating space has a second opening, allowing the fixing pillar to enter the second accommodating space from the second opening.

4. The electronic device according to the claim 3, wherein each end of the two first holding arms, far away from the first fixing base, has a first tooth, each end of the two second holding arms, far away from the second fixing base, has a second tooth, and the first teeth are configured to hold the fixing pillar in the first accommodating space, and the second teeth are configured to hold the fixing pillar in the second accommodating space.

5. The electronic device according to the claim 4, wherein the cover further comprises a first stopper and a second stopper that are disposed on the side of the first covering member far away from the casing, and the first stopper is located in the first accommodating space, the first stopper and the first teeth are configured to hold the fixing pillar in the first accommodating space, the second stopper is located in the second accommodating space, and the second stopper and the second teeth are configured to hold the fixing pillar in the second accommodating space.

6. The electronic device according to the claim 1, wherein the second covering member has a power switch which is electrically connected to the electronic assembly.

7. The electronic device according to the claim 6, wherein the first covering member has a plurality of cable arrangement structures that are disposed on a surface of the first covering member facing away from the casing.

\* \* \* \* \*